US012813043B2

(12) United States Patent
Um et al.

(10) Patent No.: US 12,813,043 B2
(45) Date of Patent: Nov. 24, 2026

(54) DISPLAY DEVICE USING MICRO LED

(71) Applicant: LG ELECTRONICS INC., Seoul (KR)

(72) Inventors: Jaegwang Um, Seoul (KR); Dohyung Lee, Seoul (KR); Sangdae Park, Seoul (KR); Hwankuk Yuh, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 609 days.

(21) Appl. No.: 18/013,744

(22) PCT Filed: Jul. 3, 2020

(86) PCT No.: PCT/KR2020/008747
§ 371 (c)(1),
(2) Date: Dec. 29, 2022

(87) PCT Pub. No.: WO2022/004926
PCT Pub. Date: Jan. 6, 2022

(65) Prior Publication Data
US 2023/0307597 A1 Sep. 28, 2023

(51) Int. Cl.
*H10H 20/857* (2025.01)
*G02F 1/13357* (2006.01)
(Continued)

(52) U.S. Cl.
CPC ..... *H10H 20/857* (2025.01); *G02F 1/133603* (2013.01); *H10D 86/441* (2025.01); *H10D 86/60* (2025.01); *H10W 90/00* (2026.01)

(58) Field of Classification Search
CPC ............... H01L 25/0753; H01L 25/167; H01L 21/6835; H10H 20/857; H10H 20/0364; H10D 86/60; H10D 86/441
See application file for complete search history.

(56) References Cited

U.S. PATENT DOCUMENTS

2020/0074926 A1 3/2020 Lin et al.
2022/0005994 A1* 1/2022 Morita ................ G09G 3/3233

FOREIGN PATENT DOCUMENTS

JP 2015-138902 7/2015
JP 2018-182309 11/2018
(Continued)

OTHER PUBLICATIONS

Korean Intellectual Property Office Application No. 10-2022-7046235, Office Action dated Jul. 22, 2024, 8 pages.
(Continued)

*Primary Examiner* — Tony Tran
(74) *Attorney, Agent, or Firm* — LEE, HONG, DEGERMAN, KANG & WAIMEY

(57) ABSTRACT

The present invention can be applied to the technical field of display devices, and relates to a display device using, for example, a micro light emitting diode (LED). A display device using a light emitting diode according to the present invention may comprise: a thin film transistor (TFT) substrate which includes a TFT for driving an active matrix and a connection pad connected to the TFT; a light emitting package including a unit pixel which is positioned on the TFT substrate and electrically connected to the connection pad, wherein the light emitting package includes a transparent resin layer, a wiring layer positioned on the TFT substrate, and at least two light emitting diodes which are connected to each other in series and are each positioned between the TFT substrate and the transparent resin layer and electrically connected to the wiring layer to form a sub pixel; and a connection wire electrically connecting the wiring layer and the connection pad.

8 Claims, 13 Drawing Sheets

(51) Int. Cl.

| | |
|---|---|
| ***H10D 86/40*** | (2025.01) |
| ***H10D 86/60*** | (2025.01) |
| ***H10W 90/00*** | (2026.01) |

(56) References Cited

FOREIGN PATENT DOCUMENTS

| | | |
|---|---|---|
| KR | 1020040075019 | 8/2004 |
| KR | 10-2009-0064469 | 6/2009 |
| KR | 1020160066240 | 6/2016 |
| KR | 10-2018-0046491 | 5/2018 |
| KR | 10-2018-0086003 | 7/2018 |
| KR | 1020190070633 | 6/2019 |
| KR | 10-2019-0137458 | 12/2019 |
| KR | 1020200005711 | 1/2020 |

OTHER PUBLICATIONS

PCT International Application No. PCT/KR2020/008747, Written Opinion and International Search Report dated Mar. 29, 2021, 13 pages.

Korean Intellectual Property Office Application No. 10-2022-7046235, Notice of Allowance dated Nov. 19, 2025, 3 pages.

* cited by examiner

DISPLAY DEVICE USING MICRO LED

CROSS-REFERENCE TO RELATED APPLICATIONS

This application is the National Stage filing under 35 U.S.C. 371 of International Application No. PCT/KR2020/008747, filed on Jul. 3, 2020, the contents of which are hereby incorporated by reference herein its entirety.

TECHNICAL FIELD

The present disclosure is applicable to a display device-related technical field, and relates, for example, to a display device using a micro Light Emitting Diode (LED).

BACKGROUND ART

Recently, in a field of a display technology, display devices having excellent characteristics such as thinness, flexibility, and the like have been developed. On the other hand, currently commercialized major displays are represented by a LCD (liquid crystal display) and an OLED (organic light emitting diode).

On the other hand, LED (light emitting diode), which is a well-known semiconductor light-emitting element that converts electric current into light, has been used as a light source for a display image of an electronic device including an information and communication device along with a GaP:N-based green LED, starting with commercialization of a red LED using a GaAsP compound semiconductor in 1962. Accordingly, a method for solving the above-described problems by implementing a display using the semiconductor light-emitting element may be proposed. Such light emitting diode has various advantages, such as long lifespan, low power consumption, excellent initial driving characteristics, high vibration resistance, and the like, compared to a filament-based light-emitting element.

Such LEDs have been mainly used for lighting in the related art, but are gradually configuring display pixels or being used as backlights. Such LEDs may be used in the form of packages.

In the case of the related-art LED packages, most of them have a parallel connection structure and are based on Passive Matrix (PM) driving on the basis of Printed Circuit Board (PCB), so power efficiency is not excellent.

To compensate for this, TFT-based Active Matrix (AM) driving has been proposed. However, despite the high level of TFT design and process technology, there is a limit to the development of essential technologies for the red (R), green (G) and blue (B) chip configurations of LED packages, reflecting most of the driving technologies that reflect low power efficiency, which raises problems such as display heat and the like.

In particular, the red LED includes an issue of efficiency lower than that of green LED or blue LED and an issue of non-uniformity of electrochemical properties due to heat. For this reason, brightness is supplemented by driving at a relatively high current to achieve the target brightness or by a large-sized TFT even though there is a limit to a pixel size.

In addition, due to the luminance-current-voltage electrical characteristics of LED, the deviation of luminance is quite large even in the low voltage range or the low current range, so gray expression is not easy. That is, a display device using an LED has a disadvantage in that it is difficult to adjust a low gray scale.

Therefore, structural improvement is needed to overcome these problems.

DISCLOSURE

Technical Tasks

One technical task of the present disclosure is to provide a display device using a micro LED that may improve the power consumption of the display device by increasing the proportion of LED in TFT in the ratio of the power consumption of the display device.

Another technical task of the present disclosure is to provide a display device using a micro LED that may improve brightness uniformity by facilitating gray expression in a low luminance area.

Further technical task of the present disclosure is to provide a display device using a micro LED that may improve color reproduction of the display device and may be applied to a backlight by improving white balance.

Technical Solutions

In first technical aspect of the present disclosure, provided is a display device using light emitting elements, the display device including a Thin Film Transistor (TFT) substrate including a TFT for active matrix driving and a connection pad connected to the TFT, a light emitting package including a unit pixel electrically connected to the connection pad by being located on the TFT substrate, the light emitting package comprising a transparent resin layer, a wiring layer located on the TFT substrate, and at least two light emitting elements located between the TFT substrate and the transparent resin layer and connected in series to each other to form sub-pixels by being electrically connected to the wiring layer, respectively, and a connection wiring for connecting the wiring layer and the connection pad to each other electrically.

The light emitting package may include the light emitting elements emitting three primary colors of light and the light emitting element emitting at least one color among the light emitting elements emitting the three primary colors may be configured in a manner that at least two light emitting elements are connected in series.

The wiring layer may include a first wiring layer connected to the connection pad and a first electrode of the light emitting element and a second wiring layer connected to a second electrode of the light emitting element.

The second wiring layer connected to the second electrode of at least one of the light emitting elements may be connected to a common electrode.

The display device may include a connection line connecting the first wiring layer and the second wiring layer neighboring thereto together.

The connection line may connect the first wiring layer and the second wiring layer connected to two light emitting elements emitting a same color together.

A thickness of the transparent resin layer is smaller than that of the light emitting element.

The TFT substrate may further include an insulating layer covering the TFT and an adhesive layer may be provided between the insulating layer and the wiring layer.

The connection wiring may electrically connect the wiring layer and the connection pad together.

The at least two light emitting elements connected in series together may include at least two active layers disposed by leaving a conductive semiconductor layer in-between to emit light of a same color.

The at least two light emitting elements connected in series together may include red light emitting elements.

In a second technical aspect of the present disclosure, provided is a display device using light emitting elements, the display device including a Thin Film Transistor (TFT) substrate including a TFT for active matrix driving and a connection pad connected to the TFT, a light emitting package including a unit pixel electrically connected to the connection pad by being located on the TFT substrate, the light emitting package comprising a transparent resin layer, a wiring layer located on the TFT substrate, and at least two light emitting elements located between the TFT substrate and the transparent resin layer and connected in series to each other to form sub-pixels by being electrically connected to the wiring layer, respectively, a connection wiring for connecting the wiring layer and the connection pad to each other electrically, and a liquid crystal display panel located on the light emitting package and comprising a driving TFT and a polarizing film.

Advantageous Effects

According to one embodiment of the present invention, there are the following effects.

First, an entire display device to which a TFT substrate and a light emitting package are added may be planarized to a thickness level of approximately 10 μm.

Moreover, the thickness of a top portion of an LED is considerably reduced, so that color clarity when viewed from the outside may be improved.

In addition, color clarity may be increased by reducing a difference in thickness of a display device.

In addition, diffuse reflection may be prevented by such planarization, and thus display visibility may be increased.

In addition, it is possible to increase the weight from TFT to LED in the ratio of power consumption of a display device. Accordingly, the power consumption of the display device may be improved.

In addition, according to such a configuration, grayscale expression is facilitated in a low luminance region, thereby improving brightness uniformity.

In addition, when the present disclosure is applied to a backlight of a liquid crystal display device, the color of the backlight may also be improved, and a white balance of white light of the backlight may be adjusted accordingly, thereby improving the image quality of the liquid crystal display device.

In addition, a backlight is applied to the local dimming technology, thereby maximizing a corresponding effect.

In addition, since a size of an LED configuring a pixel in a backlight is small, light leakage may be minimized.

Moreover, a display device using the light emitting element having the above-described structure is applicable to various display devices as well as to the liquid crystal display device described above.

Furthermore, according to another embodiment of the present disclosure, there are additional effects not mentioned herein. Those of ordinary skill in the art may understand it through the full text of the specification and drawings.

BEST MODE FOR DISCLOSURE

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions.

In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between them.

The display device described herein is a concept including all display devices that display information with a unit pixel or a set of unit pixels. Therefore, the display device may be applied not only to finished products but also to parts. For example, a panel corresponding to a part of a digital TV also independently corresponds to the display device in the present specification. The finished products include a mobile phone, a smartphone, a laptop, a digital broadcasting terminal, a personal digital assistant PDA, a portable multimedia player PMP, a navigation system, a slate PC, a tablet, an Ultrabook, a digital TV, a desktop computer, and the like.

However, it will be readily apparent to those skilled in the art that the configuration according to the embodiments described herein is applicable even to a new product that will be developed later as a display device.

In addition, the semiconductor light emitting element mentioned in this specification is a concept including an LED, a micro LED, and the like, and may be used interchangeably therewith.

Figure 1:
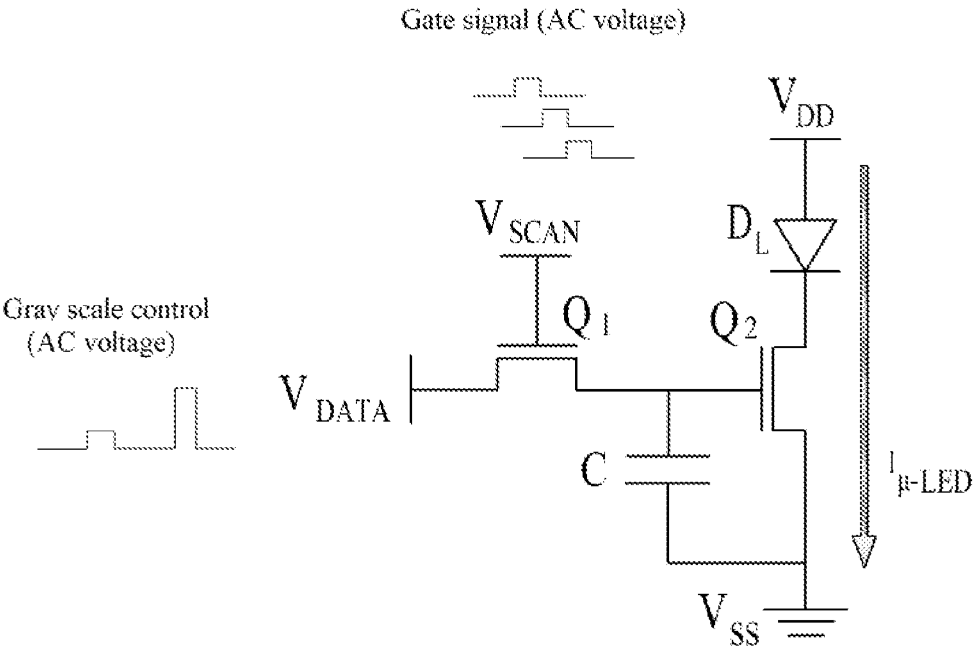
FIG. 1 is a circuit diagram illustrating an example of a pixel driving circuit applicable to the present disclosure.
Figure 2:
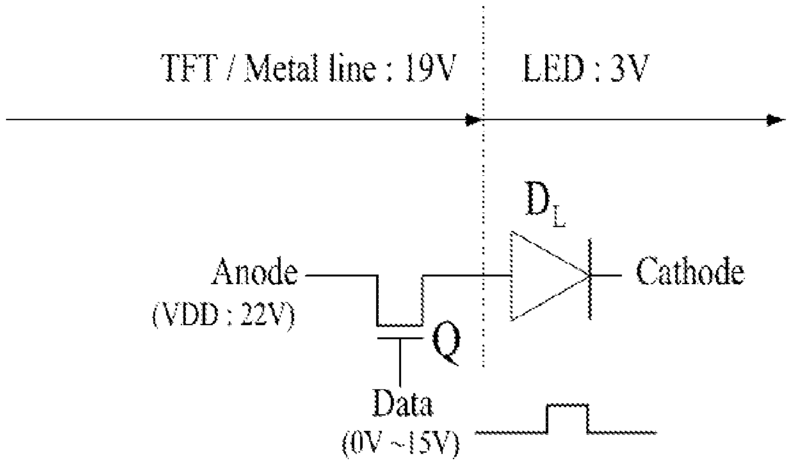
FIG. 2 shows an equivalent circuit schematically illustrating FIG. 1.
Figure 3:
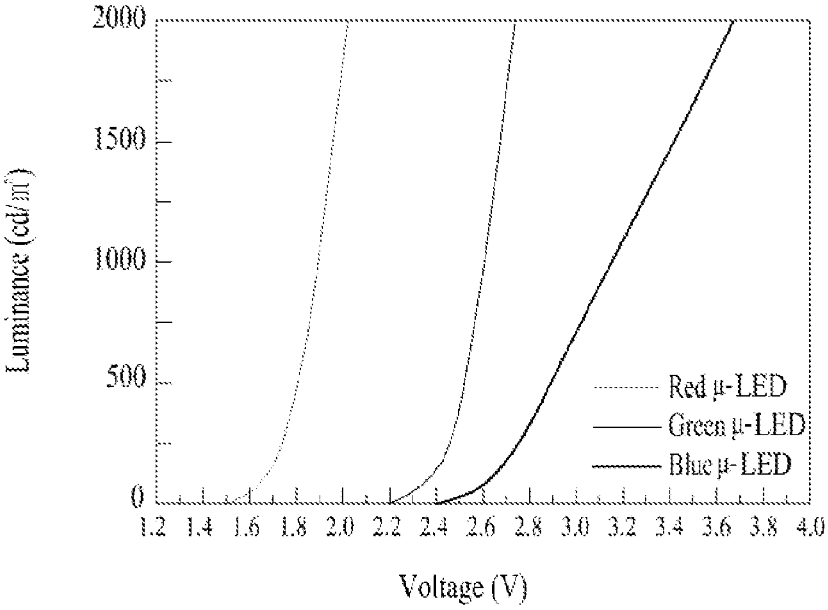
FIG. 3 is a graph illustrating luminance of a light emitting element of FIG. 1 compared to voltage for each color.

FIG. 1 is a circuit diagram illustrating an example of a pixel driving circuit applicable to the present disclosure. FIG. 2 shows an equivalent circuit schematically illustrating FIG. 1. FIG. 3 is a graph illustrating luminance of a light emitting element of FIG. 1 compared to voltage for each color.

First, features and related issues of a pixel driving circuit will be briefly described with reference to FIGS. 1 to 3.

Referring to FIG. 1, a pixel driving circuit includes a driving thin film transistor Q2 directly connected to a light emitting element $D_L$, and a switching thin film transistor Q1 connected to a data line $V_{DATA}$ and a scan line $V_{SCAN}$ to perform a switching operation.

As described above, there are four main wirings $V_{DD}$, $V_{SS}$, $V_{DATA}$, and $V_{SCAN}$ in a single pixel. Such a Thin Film Transistor (TFT) is connected to each sub-pixel to drive the light emitting element $D_L$ in each sub-pixel.

A pixel transistor area is formed by the thin film transistor TFT connected to the data line $V_{DATA}$ and the scan line $V_{SCAN}$.

In addition, a light emitting area (or a display area) in which an individual light emitting element $D_L$ is driven by the thin film transistor TFT is formed.

An individual pixel area including the pixel transistor area and the light emitting area is formed, and a plurality of the individual pixel areas are formed to configure a display.

As described above, there are four main wirings $V_{DD}$, $V_{SS}$, $V_{DATA}$, and $V_{SCAN}$ in a single pixel.

These four wirings s $V_{DD}$, $V_{SS}$, $V_{DATA}$, and $V_{SCAN}$ may include a scan line $V_{SCAN}$ connected to the switching thin film transistor Q1, a data line $V_{DATA}$ connected to the driving thin film transistor Q2, a gate-off voltage line $V_{SS}$ connected to the driving thin film transistor Q2, and a gate-on voltage line $V_{DD}$ connected to an anode of the light emitting element $D_L$.

Here, the gate-on voltage $V_{DD}$ corresponds to the highest voltage applied to drive the light emitting element $D_L$.

When the driving voltage $V_{DATA}$ and the common voltage $V_{SCAN}$ are applied, a switching operation in which on/off of signal transmission is determined occurs in the switching thin film transistor Q1.

By such a switching operation, in the driving thin film transistor Q2, the voltage applied to the light emitting element $D_L$ substantially according to the driving voltage $V_{DATA}$ and a current (Iμ-LED) flowing through the light emitting element $D_L$ correspondingly are determined.

That is, in the switching thin film transistor Q1, an operation may occur in a switching area, and in the driving thin film transistor Q2, an operation may occur in a linear area before saturation.

FIG. 2 illustrates an equivalent circuit schematically representing the circuit diagram of FIG. 1. That is, the switching thin film transistor Q1 and the driving thin film transistor Q2 are expressed as a single switch Q. Moreover, it is expressed that the light emitting element $D_L$ is connected between an anode and a cathode.

Referring to FIG. 2, the driving conditions of the light emitting element (LED or OLED) TV may include 22V of $V_{DD}$, −6V~20V of gate voltage (common voltage $V_{SCAN}$), and 0V~15V of driving voltage $V_{DATA}$.

Here, the voltage applied to the TFT or wiring line may include about 19V and the voltage consumed by the light emitting element $D_L$ may include 3V.

In this case, the power consumption ratio may be defined as a voltage applied to the TFT or wiring line to a voltage consumed by the light emitting diode $D_L$. The light emitting element shows high luminance variation in a change in a dense voltage range.

Considering these circumstances, most of the power for target luminance is consumed by the TFT and wiring line.

Furthermore, referring to FIG. 3, the luminance characteristics of the light emitting element LED with respect to an applied voltage differ for each color.

Figure 4:
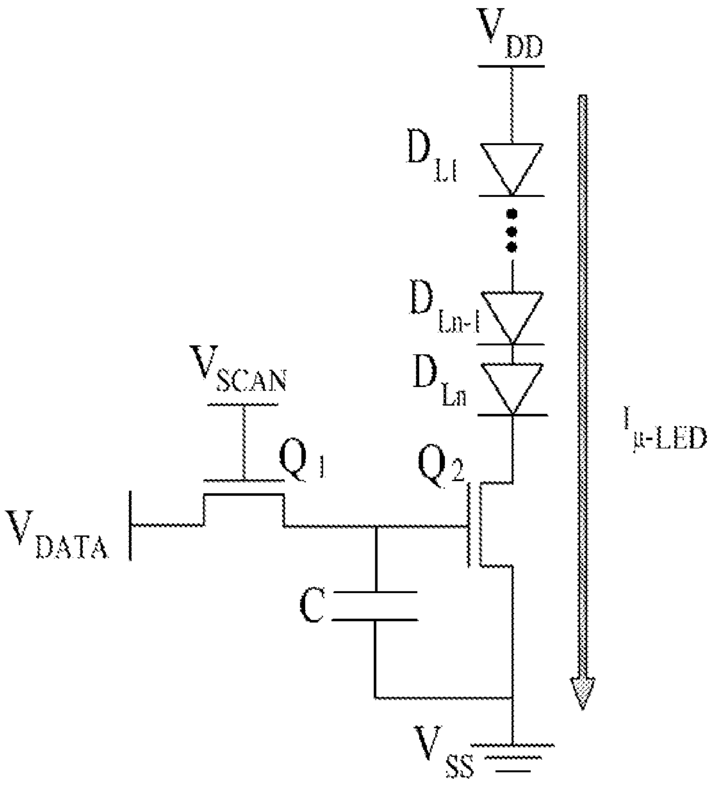
FIG. 4 is a circuit diagram illustrating an example of a pixel driving circuit of a display device according to one embodiment of the present disclosure.
Figure 5:
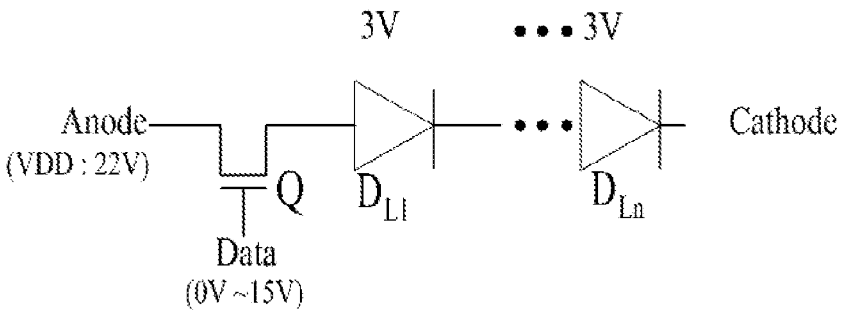
FIG. 5 is an equivalent circuit schematically illustrating FIG. 4.

FIG. 4 is a circuit diagram illustrating an example of a pixel driving circuit of a display device according to one embodiment of the present disclosure. FIG. 5 is an equivalent circuit schematically illustrating FIG. 4.

Referring to FIG. 4 and FIG. 5, light emitting elements $D_{L1}$ . . . $D_{Ln-1}$, and $D_{Ln}$ connected to each other in series to form sub-pixels respectively in a light emitting device package constituting an individual pixel may be configured.

In addition, the light emitting elements $D_{L1}$ . . . $D_{Ln-1}$, and $D_{Ln}$ may include light emitting elements emitting three primary colors of light. For example, a red LED, a green LED, and a blue LED may be included in the light emitting device package.

In this case, the light emitting element emitting at least one color may be configured in a manner of connecting at least two light emitting elements in series. The light emitting elements connected in series may be, for example, a red LED.

In this way, when at least two light emitting elements are connected in series to form a pixel, a proportion from TFT to LED may be raised in the ratio of power consumption of the display device. In this case, as described above, the power consumption ratio may be defined as the voltage consumed by the light emitting element $D_L$ over the voltage applied to the TFT or wiring line, thereby improving the power consumption of the display device.

In addition, according to such a configuration, grayscale expression is facilitated in a low luminance region, whereby brightness uniformity may be improved.

According to the present disclosure, thickness of a light emitting package may be reduced with such a pixel structure, whereby a display device capable of improving color reproduction rate and uniformity may be provided. Hereinafter, a detailed structure of a display device having such features will be described in detail.

Figure 6:
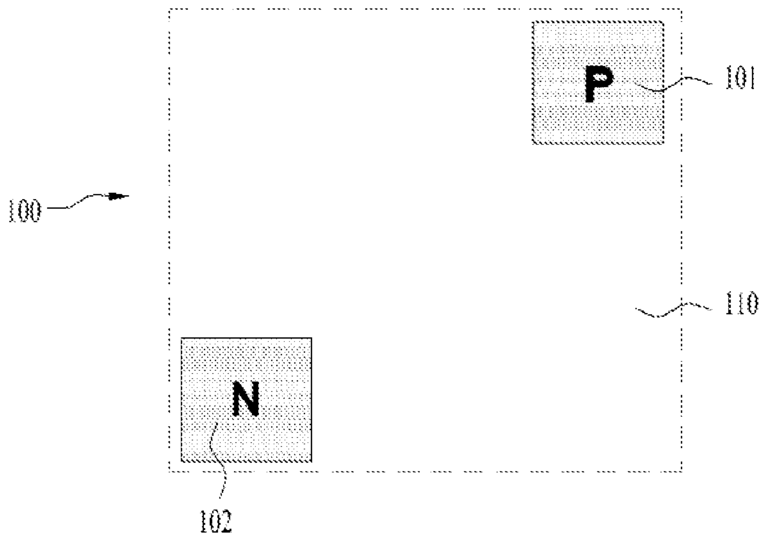
FIG. 6 is a schematic layout illustrating a portion of a TFT substrate of a display device according to a first embodiment of the present disclosure.
Figure 7:
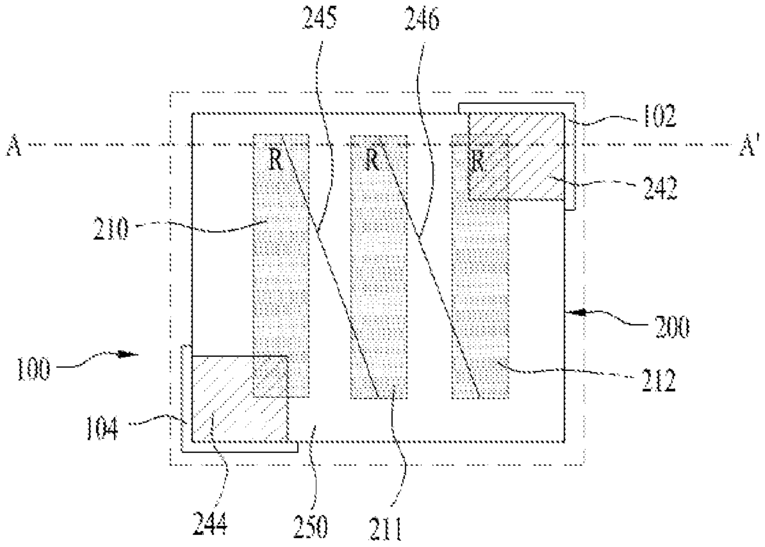
FIG. 7 is a layout illustrating a display device according to a first embodiment of the present disclosure.
Figure 8:
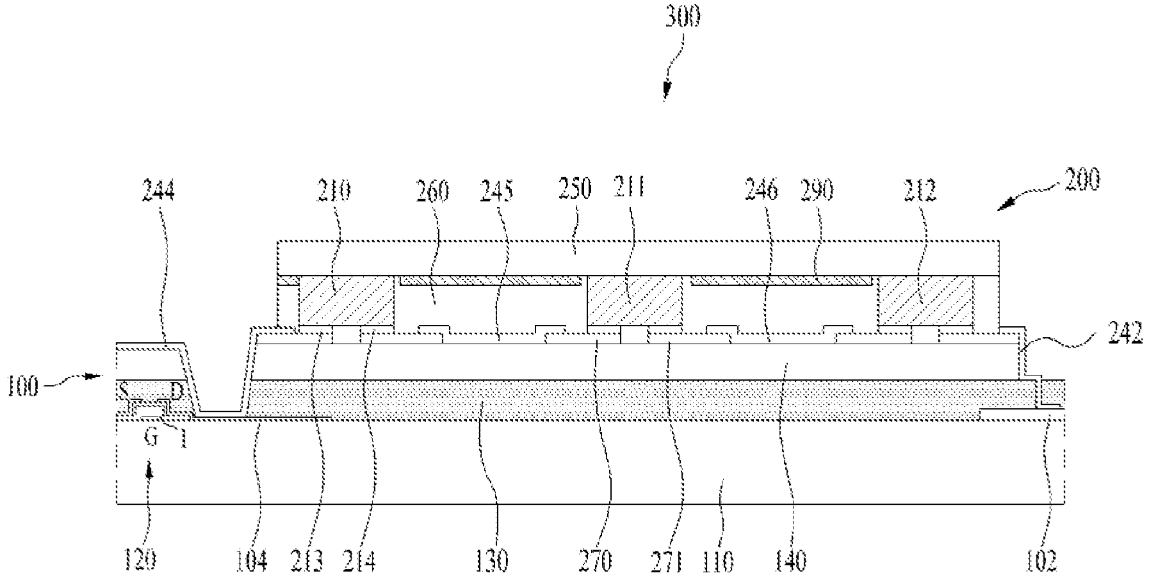
FIG. 8 is a cross-sectional diagram taken along a line A-A' of FIG. 7.

FIG. 6 is a schematic layout illustrating a portion of a TFT substrate of a display device according to a first embodiment of the present disclosure. FIG. 7 is a layout illustrating a display device according to a first embodiment of the present disclosure. FIG. 8 is a cross-sectional diagram taken along a line A-A' of FIG. 7.

Hereinafter, the configuration of a display device 300 according to a first embodiment of the present disclosure will be described with reference to FIGS. 2 to 4. Here, a pixel of the display device is described, for example, as a Light Emitting Diode (LED).

First, referring to FIG. 6, two connection pads 102 and 104 may be disposed on a base substrate 110 in a unit pixel area of a TFT substrate 100. In addition, regarding the TFT substrate 100, a Thin Film Transistor (TFT) 120 (see FIG. 8) for active matrix driving may be disposed on the base substrate 110.

The two connection pads 102 and 104 may be positioned at two corners of the unit pixel area that is rectangular. Namely the two connection pads 102 and 104 may be positioned on diagonal sides facing each other in the rectangular unit pixel area.

A light emitting package 200 including LEDs 210, 211, and 212 that emit light of the same color connected in series with each other may be mounted on the TFT substrate 100. In this case, the same color may mean red. However, LEDs that emit lights of green, blue, or different r color other than red may be connected in series.

In this case, a light emitting package 200 that emits light of a different color may be configured in another light emitting package 200. For example, if one light emitting package 200 has a configuration in which red LEDs are connected in series, the neighboring light emitting package 200 may have a configuration in which green LEDs or blue LEDs are connected in series. Alternatively, the neighboring light emitting package 200 may be configured by combining LEDs emitting two or more colors with each other.

The two connection pads 102 and 104 may include a first pad 104 to which a first electrode (e.g., a P electrode 213) of a red LED 210 (see FIG. 8) is electrically connected and a second pad 102 electrically connected to a second electrode 214 of another red LED 212 connected in series with the red LED 210.

Referring to FIG. 7, the light emitting package 200 provided with the LEDs 210, 211, and 212 to form an individual pixel may be mounted on the TFT substrate 100. For example, three red LEDs 210, 211, and 212 connected to each other in series may be mounted on the individual light emitting package 200.

The light emitting package 200 may be positioned in a manner that three red LEDs 210, 211, and 212 described above are attached on a transparent resin layer 250.

The light emitting package 200 may be connected to the TFT substrate 100 via connection wirings 242 and 244. That is, the connection wirings 242 and 244 may be electrically connected to the connection pads 102 and 104 of the TFT substrate 100, respectively. Specifically, the connection wirings 242 and 244 may electrically connect wiring layers 270 and 271 (see FIG. 8), on which the three red LEDs 210, 211, and 212 are mounted, to the connection pads 102 and 104, respectively.

Referring to FIG. 8, in the TFT substrate 100 of the display device according to the first embodiment of the present disclosure, the Thin Film Transistor (TFT) 120 for active matrix driving may be disposed on the base substrate 110.

Regarding the TFT 120, a gate electrode G and an insulating layer I may be located on the base substrate 110, a semiconductor layer may be located on this insulating layer, and a source electrode S and a drain electrode D may be located on both sides of the semiconductor layer. Here, further description of the TFT 120 will be omitted.

An insulating layer 130 for covering and planarizing the TFT 120 may be located on the TFT 120, and an adhesive layer or an insulating film 140 may be located on the insulating layer 130.

Wiring layers 270 and 271 on which LEDs 210, 211, and 212 are mounted may be arranged on the adhesive layer or the insulating film 140.

The wiring layers 270 and 271 may include a first wiring layer 270 connected to the first electrode 213 of the LED 210/211/212 and a second wiring layer 271 connected to the second electrode 214 of the LED 210/211/212.

In this case, the first wiring layer 270 may be a pixel electrode (or a data electrode), and the second wiring layer 271 may be a common electrode. Although not shown in FIGS. 6 to 8, the first wiring layer 270 and the second wiring layer 271 may be disposed to cross each other. As described above, an area where the first wiring layer 270 and the second wiring layer 271 cross each other may form a single pixel.

As described above, the first wiring layer 270 may be electrically connected to the connection pad 104 via the connection wiring 244. In addition, the second wiring layer 271 may be electrically connected to the connection pad 102 via the connection wiring 242.

Besides, the first electrode 213 of the red LED 210 may be connected to the first pad 104 through the connection wiring 244 by being connected to the first wiring layer 270, and the second electrode 214 of the rightmost red LED 212 may be connected to the second pad 102 through the connection wiring 242 by being connected to the second wiring layer 271.

In addition, a connection line 245 connecting the first wiring layer 270 and the second wiring layer 271 neighboring thereto together may be provided. That is, for serial connection of the red LEDs 210, 211, and 212, the connection line 245 connecting the LEDs to each other may be provided on the adhesive layer or the insulating film 140.

Referring to FIG. 8, the second wiring layer 271 of the LED 210 on the left may be connected to the first wiring layer 270 of the LED 211 in the middle via the connection line 245. Likewise, the second wiring layer 271 of the middle LED 211 may be connected to the first wiring layer 270 of the right LED 212 via a connection line 246.

In this way, the connection line 245/246 may connect the first wiring layer 270 and the second wiring layer 271, which are connected to two light emitting elements emitting the same color, respectively, to each other.

Meanwhile, a black matrix 290 may be positioned among the LEDs 210, 211, and 212. The black matrix 290 may improve the contrast of the pixels.

Referring to FIG. 8, it may be seen that each of the LEDs 210, 211, and 212 is located between a transparent resin layer 250 and the wiring layers 270 and 271. In this case, the thickness of the transparent resin layer 250 may be smaller than the thicknesses of the LEDs 210, 211, and 212.

The LED 210/211/212 constituting a sub-pixel may have a size in micrometers (μm). The micrometer (μm) size may mean that a width of at least one side of the light emitting element 210/211/212 has a size of several to several hundreds of micrometers (μm). Specifically, in the case of FIG. 8, the thickness in the vertical direction may have a thickness of approximately 10 μm. In comparison, the thickness of the transparent resin layer 250 may be approximately 2 μm.

Referring to FIG. 8, according to the first embodiment of the present disclosure, it may be seen that the thickness of an upper portion of the LED, that is, the total thickness of the LED 210/211/212 and the transparent resin layer 250 is about 12 μm.

In particular, the thickness of the transparent resin layer 250 is about 2 μm, and the thickness of the upper portions of the LEDs 210, 211, and 212 may be significantly reduced. Considering that a step difference of the total thickness of the TFT substrate 100 and the light emitting package 200 is usually about 6 μm, it can be seen that the entire display device with the TFT substrate 100 and the light emitting package 200 can be planarized to the thickness of about 10 μm.

Moreover, the thickness of the upper portions of the LEDs 210, 211, and 212 is greatly reduced, and thus color clarity when viewed from the outside may be improved.

In addition, color clarity may be increased by reducing the step difference in the thickness of the display device. Moreover, diffuse reflection may be prevented by such planarization, and thus display visibility may be increased.

As described above, according to the present disclosure, the thickness of the light emitting package may be reduced with the above-described pixel structure, thereby providing a display device capable of improving color reproducibility and uniformity.

In addition, when at least two light emitting elements are connected in series to form a pixel, a proportion from TFT to LED may be raised in the ratio of power consumption of the display device. In this case, as described above, the power consumption ratio may be defined as the voltage consumed by the light emitting element $D_L$ over the voltage applied to the TFT or wiring line, thereby improving the power consumption of the display device.

In addition, according to such a configuration, grayscale expression is facilitated in a low frequency region, thereby improving brightness uniformity.

Figure 9:
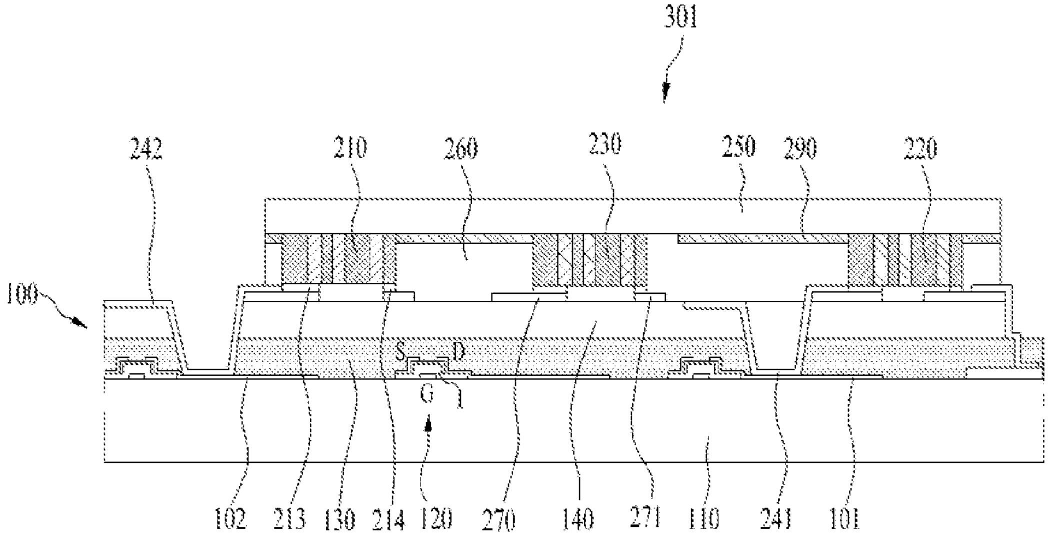
FIG. 9 is a cross-sectional view illustrating a display device according to a second embodiment of the present disclosure.

FIG. 9 is a cross-sectional view illustrating a display device according to a second embodiment of the present disclosure. Hereinafter, a configuration of a display device 301 according to a second embodiment of the present disclosure will be described with reference to FIG. 9. Like the first embodiment, here, a pixel of the display device is described as an example of a Light Emitting Diode (LED).

First, referring to FIG. 9, four connection pads 101, 102, 103, and 104 may be disposed on a base substrate 110 in a unit pixel area of a TFT substrate 100. Here, since FIG. 9 shows a partial cross-section, only two connection pads 101 and 102 may be illustrated In addition, since a phrase such as 'first' and 'second' connected to the connection pad is provided for distinction, it may not match other embodiments.

In addition, the TFT substrate 100 may have a Thin Film Transistor (TFT) 120 disposed on the base substrate 110 for active matrix driving.

These connection pads may include a first pad 102 to which a first electrode (e.g., a P-electrode) 213) of a red LED 210 is electrically connected and a second pad 101 to which a first electrode 213 of a green LED 220 is electrically connected. Here, for convenience, first and second electrodes of the green LED 220 and a blue LED 230 will also be described using the same reference numbers '213' and '214' as the first and second electrodes of the red LED 210.

Although not shown in the cross-section in FIG. 9, the connection pads may include a third pad (not shown) to which the first electrode 213 of the blue LED 230 is electrically connected and a fourth pad (not shown) to which the second electrodes (e.g., N-electrodes) 214 of the red LED 210, the green LED 220 and the blue LED 230 are connected in common.

Referring to FIG. 9, a light emitting package 200 provided with these LEDs 210, 220, and 230 to form an individual pixel may be mounted on the TFT substrate 100. The red LED 210, the green LED 220 and the blue LED 230 may be mounted on the individual light emitting package 200. Each of the LEDs 210, 220, and 230 forms a sub-pixel, and may configure a pixel that emits full color by lighting the red LED 210, the green LED 220, and the blue LED 230.

The light emitting package 200 may be positioned in a manner that the red LED 210, the green LED 220, and the blue LED 230 described above are attached on a transparent resin layer 250.

The light emitting package 200 may be connected to the TFT substrate 100 via connection wirings 241 and 242. That is, the connection wiring 242 may be electrically connected to each of the connection pads 101, 102, and 103 of the TFT substrate 100. Specifically, the connection wiring 242 may electrically connect a first wiring layer 270, on which the LEDs 210, 220, and 230 are mounted, with the connection pads 101, 102, and 103.

Meanwhile, the second wiring layer 271 may be electrically connected to the second electrodes 214 of the LEDs 210, 220, and 230. In addition, the connection wiring 241 may electrically connect the second wiring layer 271, on which the LEDs 210, 220, and 230 are mounted, with the connection pad (not shown).

A black matrix 290 may be positioned among the LEDs 210, 220, and 230. The black matrix 290 may improve the contrast of the pixel.

Referring to FIG. 9, it may be seen that the LEDs 210, 220, and 230 are positioned between the transparent resin layer 250 and the wiring layers 270 and 271. In this case, the thickness of the transparent resin layer 250 may be smaller than the thickness of the LEDs 210, 220, and 230.

The LEDs 210, 220, and 230 constituting the sub-pixels may have a size in micrometers (μm). The micrometer (μm) size may mean that the width of at least one side of the light emitting elements 210, 211, and 212 has a size of several to several hundreds of micrometers (μm). Specifically, in the case of FIG. 8, the thickness in the vertical direction may have a thickness of approximately 10 μm. In comparison, the thickness of the transparent resin layer 250 may be approximately 2 μm.

To the parts failing to be described above, a description of parts common to the parts described with reference to FIGS. 6 to 8 may be equally applied.

Figure 10:
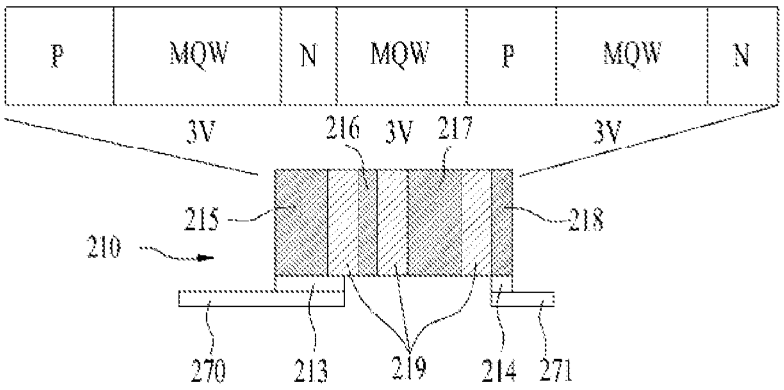
FIG. 10 is a schematic diagram illustrating a light emitting element configuring a pixel of a display device according to a second embodiment of the present disclosure.

FIG. 10 is a schematic diagram illustrating a light emitting element configuring a pixel of a display device according to a second embodiment of the present disclosure.

Referring to FIG. 10, a detailed structure of the red LED 210 is shown. Yet, the green LED 220 and the blue LED 230 may have the same structure.

As shown in the drawing, the red LED 210 may have a light emitting element structure in which at least two or more light emitting elements are connected to each other in series. That is, the red LED 210 may include at least two active layers (MQW) 219 disposed among conductive semiconductor layers 215, 216, 217, and 218 to emit light of the same color.

As a specific example, an active layer (MQW) may be located between the P-type conductive semiconductor layer 215 and the N-type conductive semiconductor layer 216 on the left side of the red LED 210 and an active layer (Multi Quantum Well (MQW)) may be located between the N-type conductive semiconductor layer 216 and the P-type conductive semiconductor layer 217 on the right side of the N-type conductive semiconductor layer 216. In addition, an active layer (MQW) may be located between the P-type conductive semiconductor layer 217 and the N-type conductive semiconductor layer 218 on the right side thereof.

In this case, the leftmost P-type conductive semiconductor layer 215 may be connected to the first electrode 213, and the rightmost N-type conductive semiconductor layer 218 may be connected to the second electrode 214.

The structure of the red LED 210 includes three active layers (MQW), and each active layer (MQW) may operate as an individual red LED. Therefore, the red LED 210 may emit light having a brightness corresponding to that of combining three LEDs. Accordingly, if a voltage of 3V is required for light emission in each active layer (MQW), a total voltage of 9V may be required to drive the red LED 210.

Accordingly, as described above, the weight from TFT to LED may be increased in the ratio of power consumption of the display device. In this case, as described above, the power consumption ratio may be defined as the voltage consumed by the light emitting device over the voltage applied to the TFT or wiring line, thereby improving the power consumption of the display device.

Figure 11:
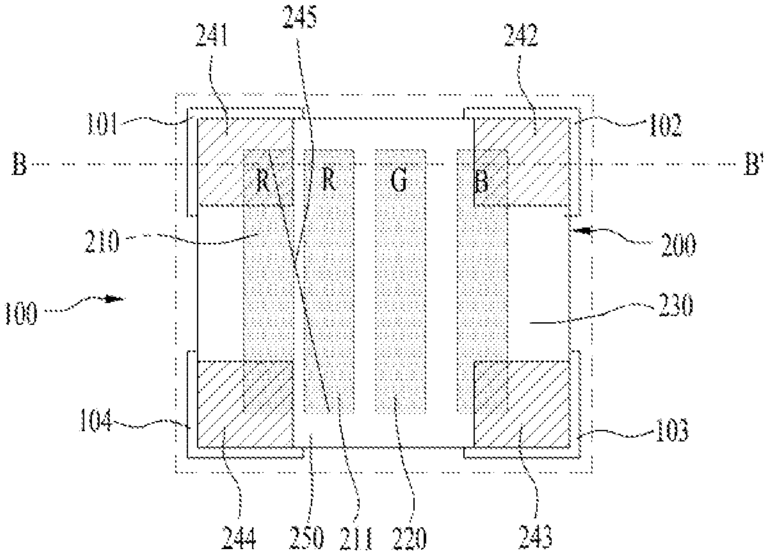
FIG. 11 is a layout illustrating a display device according to a third embodiment of the present disclosure.
Figure 12:
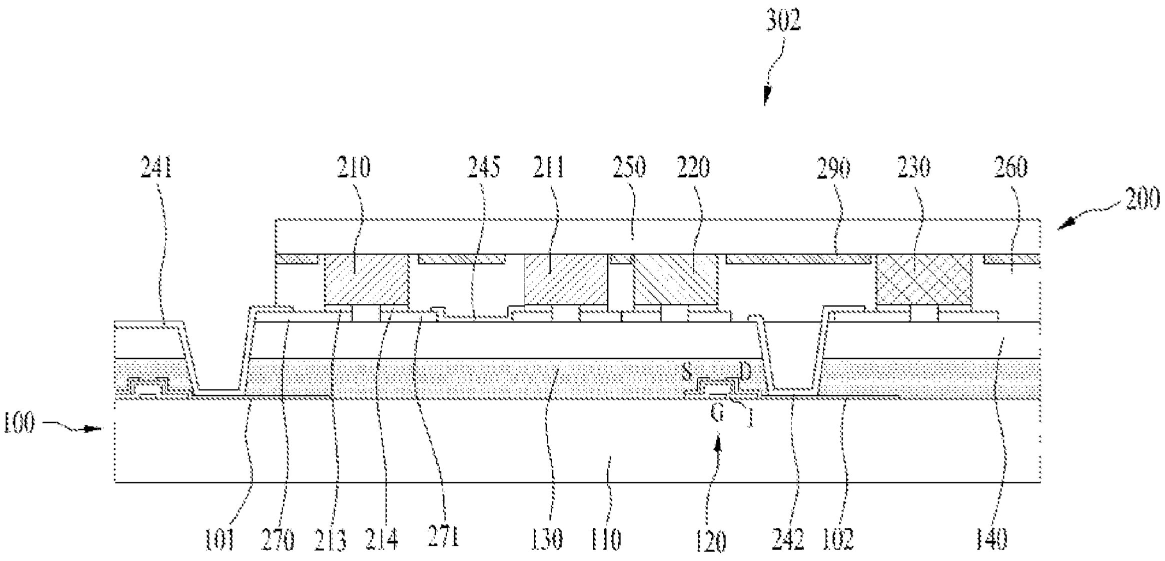
FIG. 12 is a cross-sectional view taken along line B-B' of FIG. 11.

FIG. 11 is a layout illustrating a display device according to a third embodiment of the present disclosure. FIG. 12 is a cross-sectional view taken along line B-B' of FIG. 11.

Hereinafter, a configuration of a display device 302 according to a third embodiment of the present disclosure will be described with reference to FIG. 11 and FIG. 12. Here, a pixel of the display device is described, for example, as a Light Emitting Diode (LED).

In this case, the pixels may include two red LEDs 210 and 211 connected to each other in series, a green LED 220, and a blue LED 230. In this case, the two red LEDs 210 and 211 may be connected in series to each other via a connection line 245.

First, referring to FIG. 11, four connection pads 101, 102, 103, and 104 may be disposed on a base substrate 110 in a unit pixel area of a TFT substrate 100. Moreover, in the TFT substrate 100, a Thin Film Transistor (TFT) 120 (see FIG. 12) for active matrix driving may be disposed on a base substrate 110.

The four connection pads 101, 102, 103, and 104 may be located at four corners of a rectangular unit pixel area.

These connection pads may include a first pad 101 electrically connected to a first electrode (e.g., a P electrode; 213) of each of the red LEDs 210 and 211, a second pad 102 electrically connected to a first electrode 213 of the green LED 220, a third pad 103 electrically connected to a first electrode 213 of the blue LED 230, and a fourth pad 104 connected in common to second electrodes (e.g., N-electrode) 214 of the red, green and blue LEDs 210, 220, and 230.

Here, for convenience, the first and second electrodes of the green LED 220 and the blue LED 230 will also be described using the same reference numbers 213 and 214 as the first and second electrodes of the red LED 210.

Referring to FIG. 12, a light emitting package 200 equipped with these LEDs 210, 211, 220, and 230 to configure an individual pixel may be mounted on the TFT substrate 100. Two red LEDs 210 and 211 connected to each other in series, a green LED 220, and a blue LED 230 may be provided to the individual light emitting package 200. Each of the LEDs 210, 211, 220, and 230 may form a sub-pixel, and may form a pixel that emits full color by lighting the red LEDs 210, 211, the green LED 220, and the blue LED 230.

The light emitting package 200 may be positioned in a manner that the red LEDs 210 and 211, the green LED 220, and the blue LED 230 described above are attached on a transparent resin layer 250.

The light emitting package 200 may be connected to the TFT substrate 100 via connection wirings 241, 242, 243, and 244. That is, the connection wirings 241 and 242 may be electrically connected to each of connection pads 101, 102, 103, and 104 of the TFT substrate 100. Specifically, the connection wirings 241, 242, 243, and 244 may electrically connect wiring layers 270 and 271, on which the LEDs 210, 211, 220, and 230 are mounted, and the connection pads 101, 102, 103, and 104 together.

Referring to FIG. 12, in the TFT substrate 100 of the display device according to the third embodiment of the present disclosure, a Thin Film Transistor (TFT) 120 for active matrix driving may be disposed on the base substrate 110.

In the TFT 120, a gate electrode G and an insulating layer I may be located on the base substrate 110, a semiconductor layer may be located on this insulating layer, and a source electrode S and a drain electrode D may be located on both sides of the semiconductor layer, respectively. Here, further description of the TFT 120 will be omitted.

An insulating layer 130 to cover and planarize the TFT 120 may be located on the TFT 120, and an insulating film or an adhesive layer 140 may be located on the insulating layer 130.

Wiring layers 270 and 271 on which LEDs 210, 211, 220, and 230 are mounted may be arranged on the adhesive layer 140.

The wiring layers 270 and 271 may include a first wiring layer 270 connected to first electrodes 213 of the LEDs 210, 220, and 230 and a second wiring layer 271 connected to second electrodes 214 of the LEDs 210, 211, 220, and 230.

In this case, the first wiring layer 270 may be a pixel electrode (or a data electrode), and the second wiring layer 271 may be a common electrode. Although not shown in FIG. 11 or FIG. 12, the first wiring layer 270 and the second wiring layer 271 may be disposed to cross each other. As described above, an area where the first wiring layer 270 and the second wiring layer 271 cross each other may form a single pixel.

Meanwhile, a connection line 245 connecting the first wiring layer 270 related to the red LEDs 210 and 211 and the second wiring layer 271 neighboring thereto to each other may be provided. That is, the connection line 245 connecting the respective LEDs to each other for serial connection between the two red LEDs 210 and 211 may be provided on the adhesive layer or the insulating film 140.

Referring to FIG. 12, the second wiring layer 271 of the LED 210 on the left may be connected to the first wiring layer 270 of the LED 211 on the right via the connection line 245. As described above, the connection line 245 may connect the first wiring layer 270 and the second wiring layer 271 connected to two light emitting elements that emit the same color to each other.

As described above, the first wiring layer 270 may be electrically connected to the connection pads 101, 102, and 103 by the connection wirings 241, 242, and 243. In addition, the second wiring layer 271 may be electrically connected to the connection pad 104 via the connection wiring 244 (see FIG. 11).

Comparing FIG. 11 and FIG. 12, since FIG. 11 schematically represents the plane of the display device, the positions of the connection wiring 242 and the second pad 102 may not exactly match each other. Yet, it will be understood that FIG. 11 and FIG. 12 illustrate the common invention ideas.

Besides, the first electrodes 213 of the two red LEDs 210 and 211 connected together in series are connected to the first wiring layer 270, and the wiring layer 270 connected to one 210 of the LEDs may be connected to the first pad 101 via the connection wiring 241. The first electrode 213 of the green LED 220 is connected to the first wiring layer 270 and may be connected to the second pad 102 via the connection wiring 242. The first electrode 213 of the blue LED 230 is connected to the first wiring layer 270 and may be connected to the third pad 103 via the connection wiring 243. In addition, the second electrodes 214 of the LEDs 211, 220, and 230 may be connected to the second wiring layer 271 and connected to the fourth pad 104 via the connection wiring 244.

Meanwhile, a black matrix 290 may be positioned among the LEDs 210, 211, 220, and 230. The black matrix 290 may improve the contrast of the pixel.

Referring to FIG. 12, it can be seen that each of the LEDs 210, 211, 220, and 230 is located between the transparent resin layer 250 and the wiring layers 270 and 271. In this case, the thickness of the transparent resin layer 250 may be smaller than the thickness of the LEDs 210, 220, and 230.

The LEDs 210, 211, 220, and 230 constituting the sub-pixels may have a size in micrometers (μm). The micrometer (μm) size may mean that the width of at least one side of the light emitting elements 210, 211, 220, and 230 is several to several hundreds of micrometers (μm).

As described above, according to the third embodiment of the present disclosure, it can be seen that the thickness of the upper side of the LED, that is, the total thickness of the LED 210/211/220/230 and the transparent resin layer 250, is about 12 μm.

In particular, the thickness of the transparent resin layer 250 is about 2 μm, and the thickness of the upper portion of each of the LEDs 210, 211, 220, and 230 may be significantly reduced. Considering that the step difference in thickness between the TFT substrate 100 and the light emitting package 200 is usually about 6 μm, it can be seen that the entire display device with the TFT substrate 100 and the light emitting package 200 can be planarized to a thickness of about 10 μm.

Moreover, the thickness of the upper portions of the LEDs 210, 211, 220, and 230 is greatly reduced, and thus color clarity when viewed from the outside may be improved.

In addition, color clarity may be increased by reducing the step difference in the thickness of the display device. In addition, diffuse reflection may be prevented by such planarization, and thus display visibility may be increased.

As described above, according to the present disclosure, the thickness of the light emitting package may be reduced with the above-described pixel structure, thereby providing a display device capable of improving color reproducibility and uniformity.

In addition, if at least two light emitting devices are connected in series to configure a pixel, the weight from TFT to LED may be raised in the ratio of the power consumption of the display device. In this case, as described above, the power consumption ratio may be defined as the voltage consumed by the light emitting device over the voltage applied to the TFT or wiring line, thereby improving the power consumption of the display device.

In addition, according to such a configuration, grayscale expression is facilitated in a low luminance region, thereby improving brightness uniformity.

Figure 13:
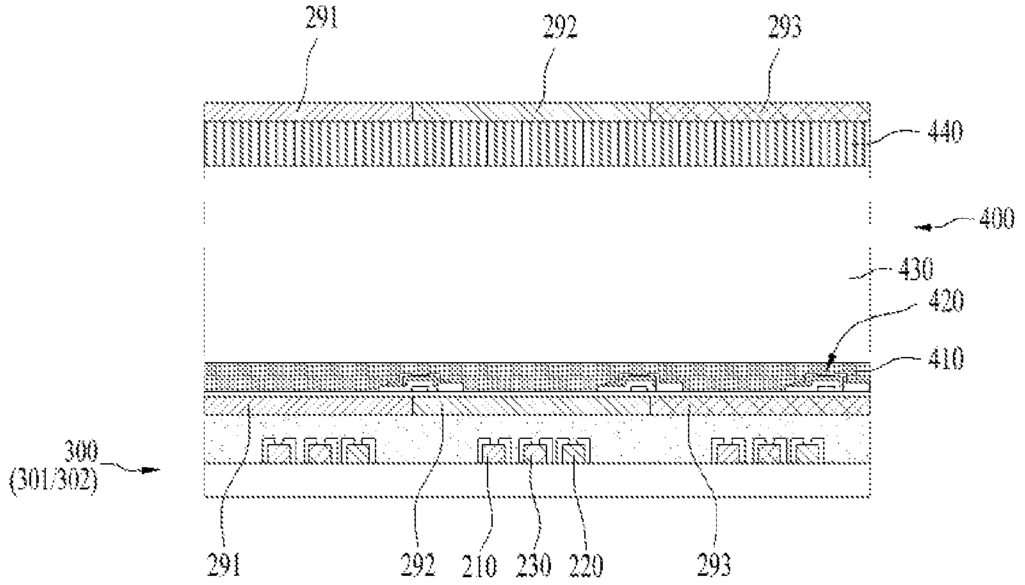
FIG. 13 is a cross-sectional view illustrating a display device according to a fourth embodiment of the present disclosure.

FIG. 13 is a cross-sectional view illustrating a display device according to a fourth embodiment of the present disclosure. FIG. 13 may illustrate a display device configured as a backlight among the display devices 300, 301, and 302 of the first to third embodiments described above. For example, the display device configured as the backlight among the display devices 300, 301, and 302 of the first to third embodiments may be a liquid crystal display device.

Referring to FIG. 13, any one of the display devices 300, 301 and 302 of the first to third embodiments may be configured as a backlight. Accordingly, the backlights 300, 301, and 302 shown in FIG. 13 may have the same configuration and technical features as the display devices 300, 301, and 302 of the first to third embodiments described above. Yet, for convenience of description, the backlights 300, 301 and 302 in FIG. 13 are briefly illustrated.

Hereinafter, for convenience of description, the backlight will be described as corresponding to the third embodiment. That is, the backlight may be the same as the display device 302 of the third embodiment. Hereinafter, the backlight and the display device will be described using the same reference number '302'.

In FIG. 13, the red LED 210, the green LED 220, and the blue LED 230 are illustrated as configuring an individual pixel. Yet, when the structure of the third embodiment is applied, it may be understood that two red LEDs 210 and 211 connected in series may be included in the individual pixel.

A liquid crystal display panel 400 may be positioned on the backlight 302. The liquid crystal display panel 400 may include a panel 430 having a liquid crystal cell provided to form an individual pixel and a driving TFT 420 for driving the individual pixel.

In this case, a polarizing film may be provided on the insulating layer 410 covering the TFT 420. In addition, a polarizing film 440 may be provided on a top side of the liquid crystal panel 430 as well.

Meanwhile, color filters 291, 292, and 293 may be provided to at least one of a space between the backlight 302 and the liquid crystal display panel 400 and a top side of the polarizing film 440 above. A detailed description of the liquid crystal display panel 400 will be omitted.

The backlight 302 having the same configuration and technical features as the display devices 300, 301, and 302 of the first to third embodiments is free to drive local dimming. That is, according to a screen implemented on the liquid crystal display panel, the pixel corresponding to the backlight 302 may be turned on/off or the brightness may be adjusted.

Accordingly, the contrast of the liquid crystal display device may be raised and color reproduction may be further improved.

As described above, the backlight having the same configuration and technical features as the display devices 300, 301, and 302 of the first to third embodiments may reduce the thickness of the light emitting package with the pixel structure, thereby improving color reproducibility and uniformity.

Therefore, the color of the backlight may also be improved, and accordingly, the white balance of the white light of the backlight may be adjusted, thereby improving the image quality of the liquid crystal display device.

In addition, when the backlight described above is applied to the local dimming technology, thereby maximizing its effect.

In addition, since the size of the LED forming the pixel in the backlight is small, light leakage may be minimized.

Moreover, the display device using the light emitting element having the structure described above is applicable to various display devices as well as to the liquid crystal display device described above.

The above description is merely illustrative of the technical idea of the present disclosure. Those of ordinary skill in the art to which the present disclosure pertains will be able to make various modifications and variations without departing from the essential characteristics of the present disclosure.

Therefore, embodiments disclosed in the present disclosure are not intended to limit the technical idea of the present disclosure, but to describe, and the scope of the technical idea of the present disclosure is not limited by such embodiments.

The scope of protection of the present disclosure should be interpreted by the claims below, and all technical ideas within the scope equivalent thereto should be construed as being included in the scope of the present disclosure.

INDUSTRIAL APPLICABILITY

According to the present disclosure, a display device using a micro Light Emitting Diode (LED) and liquid crystal display device using the same.

What is claimed is:

1. A display device using light emitting elements, the display device comprising:

a Thin Film Transistor (TFT) substrate including a TFT for active matrix driving, a connection pad connected to the TFT, and an insulating layer covering the TFT;

a light emitting package including a unit pixel, the light emitting package being located on the TFT substrate and electrically connected to the connection pad, the light emitting package comprising:

a transparent resin layer, a wiring layer located on the TFT substrate, and at least two light emitting elements located between the TFT substrate and the transparent resin layer and connected in series with each other, the at least two light emitting elements forming sub-pixels by being electrically connected to the wiring layer, respectively;

an adhesive layer provided between the insulating layer and the wiring layer; and a connection wiring for connecting the wiring layer and the connection pad to each other electrically, wherein the light emitting package comprises a plurality of first light emitting elements that emit a first color and are connected in series with each other, a second light emitting element that emits a second color, and a third light emitting element that emits a third color, wherein a connection line is provided on the adhesive layer or the insulating layer, for connecting the first light emitting elements in series, wherein any one of the plurality of first light emitting elements, the second light emitting element, and the third light emitting element has a respective first electrode which is connected to a first connection pad, a second connection pad, and a third connection pad, respectively, and wherein another one of the plurality of first light emitting elements, the second light emitting element, and the third light emitting element has a respective second electrode which is connected to a fourth connection pad.

2. The display device of claim 1, wherein the wiring layer comprises:

a first wiring layer connected to the connection pad and a first electrode of the light emitting element; and a second wiring layer connected to a second electrode of the light emitting element.

3. The display device of claim 2, wherein the second wiring layer is connected to a common electrode.

4. The display device of claim 2, wherein the connection line connects the first wiring layer and the second wiring layer neighboring thereto together.

5. The display device of claim 1, wherein a thickness of the transparent resin layer is smaller than a thickness of the light emitting element.

6. The display device of claim 1, wherein the connection wiring electrically connects the wiring layer and the connection pad together.

7. The display device of claim 1, wherein the at least two light emitting elements connected in series together include at least two active layers disposed by leaving a conductive semiconductor layer in-between to emit light of a same color.

8. The display device of claim 1, wherein the at least two light emitting elements connected in series together include red light emitting elements.

* * * * *